United States Patent
Lanzillo et al.

(10) Patent No.: US 10,886,166 B2
(45) Date of Patent: Jan. 5, 2021

(54) DIELECTRIC SURFACE MODIFICATION IN SUB-40NM PITCH INTERCONNECT PATTERNING

(71) Applicant: International Business Machines Corporation, Armonk, NY (US)

(72) Inventors: Nicholas Anthony Lanzillo, Troy, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/296,842

(22) Filed: Mar. 8, 2019

(65) Prior Publication Data

US 2020/0286776 A1    Sep. 10, 2020

(51) Int. Cl.
| | |
|---|---|
| H01L 21/768 | (2006.01) |
| H01L 23/532 | (2006.01) |
| H01L 23/528 | (2006.01) |
| H01L 21/02 | (2006.01) |

(52) U.S. Cl.
CPC .. *H01L 21/76816* (2013.01); *H01L 21/02065* (2013.01); *H01L 21/76831* (2013.01); *H01L 23/5283* (2013.01); *H01L 23/5329* (2013.01)

(58) Field of Classification Search
CPC ......... H01L 21/76816; H01L 21/02065; H01L 21/76831; H01L 23/5329; H01L 23/5283
See application file for complete search history.

(56) References Cited

U.S. PATENT DOCUMENTS

| | | | |
|---|---|---|---|
| 6,735,555 B1 | 5/2004 | Suzuki et al. | |
| 6,794,292 B2 | 9/2004 | Wu | |
| 7,022,610 B2 | 4/2006 | Chou et al. | |
| 7,172,976 B2 | 2/2007 | Wu | |
| 7,179,757 B2 | 2/2007 | RamachandraRao et al. | |
| 7,858,294 B2 | 12/2010 | Hacker et al. | |
| 8,617,993 B2 | 12/2013 | Yasseri et al. | |
| 8,932,933 B2 | 1/2015 | Laboriante et al. | |
| 9,520,459 B2 | 12/2016 | Cho et al. | |
| 9,653,307 B1 | 5/2017 | Imonigie et al. | |
| 2003/0010751 A1 | 1/2003 | Wu | |
| 2004/0124172 A1 | 7/2004 | Wu | |
| 2005/0136678 A1 | 6/2005 | Chou et al. | |
| 2009/0072401 A1* | 3/2009 | Arnold .............. | H01L 21/76826 257/751 |

(Continued)

OTHER PUBLICATIONS

Alex Usenko et al., "Silicon nitride surface conversion into oxide to enable hydrophilic bonding," ECS Transactions, vol. 33, No. 4, 2010, pp. 475-483.

(Continued)

*Primary Examiner* — Anthony Ho
(74) *Attorney, Agent, or Firm* — Cantor Colburn LLP; James Nock

(57) ABSTRACT

Back end of line metallization structures and processes of fabricating the metallization structures generally include selectively modifying a top surface of an ultra-low k dielectric intermediate trench openings. The modified top surface of the ultra-low k dielectric includes an element such as nitrogen, carbon, silicon, or mixture thereof and has greater hydrophobicity than the ultra-low k dielectric underlying the top surface.

13 Claims, 3 Drawing Sheets

(56) References Cited

U.S. PATENT DOCUMENTS

2009/0075472 A1* 3/2009 Arnold ............. H01L 21/02126
 438/623
2018/0012752 A1 1/2018 Tapily

OTHER PUBLICATIONS

H Barhoumi et al., "Experimental study of thermodynamic surface characteristics and pH sensitivity of silicon dioxide and silicon nitride," Langmuir, vol. 26, No. 10, 2010, pp. 7165-7173.
Xiao Hu Liu, "Impact of pattern collapse on future micro/nano fabrication," IEEE International Interconnect Technology Conference (IITC), 2017, 3 pp.

* cited by examiner

DIELECTRIC SURFACE MODIFICATION IN SUB-40NM PITCH INTERCONNECT PATTERNING

BACKGROUND

The present invention generally relates to semiconductor integrated circuits, and more particularly, to the structure and formation of back end of line structures including dielectric surface modification for improved mechanical strength in sub-40 nm pitch interconnect patterning.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to semiconductor structures including a back end of line metallization structure and methods of fabrication. A non-limiting example of a back end of line metallization structure according to aspects of the invention includes a dielectric layer including two or more trench openings. The dielectric layer includes an ultra-low dielectric having a k value of less than 2.2 and a top surface between trench openings modified with elements. The elements can include nitrogen, carbon, silicon and mixtures thereof to form a modified top surface. The modified top surface has greater hydrophobicity than the ultra-low k dielectric underlying the modified top surface.

A non-limiting example of a back end of the line process for forming a metallization structure layer includes depositing a dielectric layer onto a surface, wherein the dielectric layer includes an ultra-low k dielectric having a k value of less than 2.2. The dielectric layer lithographically patterned and etched to form trench openings. A top surface of the dielectric between the trench openings is selectively modified to form a modified top surface having greater hydrophobicity than the ultra-low k dielectric underlying the modified top surface. Wet processing cleans and/or removes residues from prior fabrication steps. A liner layer is deposited onto sidewalls and a bottom surface defined by trench openings. A metal is deposited onto the liner layer and into the one or more openings. A surface of the metal is planarized to remove an excess of the metal such that the uppermost surfaces of the metal and the dielectric layer are coplanar to each other.

A non-limiting example of a back end of the line process for modulating hydrophobicity at a top surface of an ultra-low k dielectric material located between trench openings in the ultra-low k dielectric material includes selectively depositing an element including nitrogen, carbon, silicon, or mixtures thereof into the top surface of the ultra-low k dielectric material. The deposited element increases hydrophobicity at the top surface relative to the ultra-low k dielectric material underlying the top surface.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally relates to back end of line (BEOL) metallization structures and processes for forming the metallization structures. The structures and processes generally include surface modification of an exposed dielectric surface located between trenches to selectively increase hydrophobicity at the top of the dielectric surface in order to prevent pattern collapse. By increasing hydrophobicity at the top surface of the dielectric material between the trenches, surface tension is decreased, thereby increasing the contact angle. As a result, pattern collapse during subsequent wet processing is prevented. As will be described in greater detail below, surface modification can be by deposition of elements such as N, C, and/or Si into the exposed dielectric top surface to increase the hydrophobicity at the top of the dielectric surface.

Pattern collapse can occur because of strong capillary forces during wet processing of a patterned feature, which is commonly used to help clean the patterned surface as well as remove residues that could have been left behind by prior fabrication steps. Fluid can fill the openings defined by the trench features during wet processing and pattern collapse can occur if the capillary force exceeds the restoring force during the local in-homogeneous drying to remove the fluid. Surface modification at the top surface of the dielectric material between trenches can prevent pattern collapse because the capillary force is made to be less than the mechanical restorative force.

Figure 1:
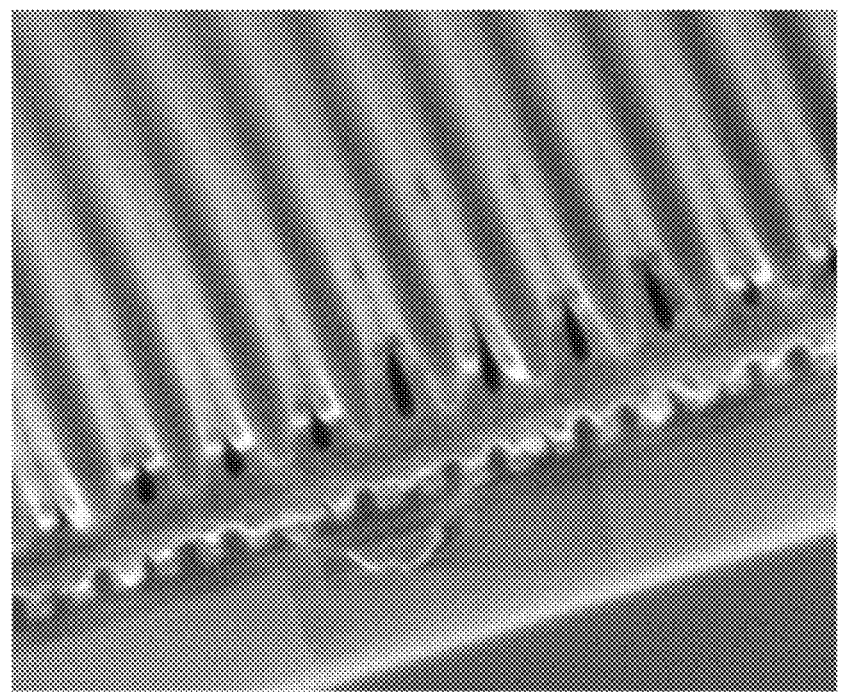
FIG. 1 is a scanning electron micrograph depicting pattern collapse subsequent to wet processing of patterning ultra-low k dielectric without surface modification at a 1:1 pitch of 48 nm.

Pattern collapse is exacerbated as devices scale down to smaller features sizes and tighter pitches. For logic nodes of 7 nm and beyond, back-end-of-line (BEOL) trench patterns have a critical pitch of less than 40 nm, which requires integration of ultra-low k dielectrics (ULK) to maintain line resistance (R) and line capacitance (C) performance. ULK's are generally dielectric materials having a dielectric constant (k) less than 2.2 and can include porous materials, among others. However, due to the inherent weaker modulus properties of ULKs and the relatively tighter pitches of less than 40 nm at technology nodes of 7 nm and beyond, pattern collapse and flop-over are significant issues. Pattern collapse can be a significant problem in semiconductor fabrication and can lead to defects in the circuits produced. For example, pattern collapse can impact plasma etch processing windows of the dual damascene etch process. FIG. 1 illustrates a scanning electron image showing a patterned ultra-low k dielectric layer of 1:1 lines and spaces at a 48 nm pitch exhibiting pattern collapse subsequent to wet processing and drying. The patterned ultra-low k dielectric layer was a porous SiCOH based dielectric having a k value of about 2.4 and did not include surface modification. Applicants have found that selectively modulating the hydrophobicity at the top of the dielectric surface between patterned interconnect trenches can be used to prevent pattern collapse.

Detailed embodiments of the integrated circuit including at least one metallization layer and methods for fabricating an integrated circuit including the at least one metallization layer according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

For the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to FIGS. 2-6, schematically illustrated is a structure and process flow for forming an integrated circuit including at least one metallization layer according to one or more embodiments of the invention.

Figure 2:
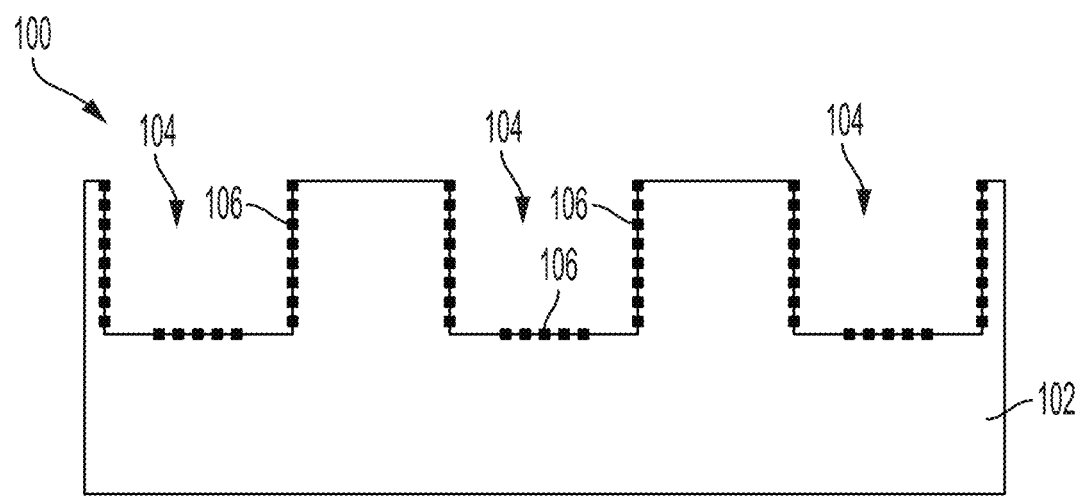
FIG. 2 depicts a cross section of an integrated circuit including a patterned dielectric layer in accordance with one or more embodiments of the present invention.

In FIG. 2, there is shown a portion of an integrated circuit 100 including a patterned dielectric layer 102 including a plurality of trenches 104, i.e., the dielectric layer subsequent to lithographically patterning and etching to form the trench openings. The thickness of the dielectric layer 102 is in a range of about 10 nm to about 500 nm. In one or more embodiments, the thickness is comparable to the pitch. For example, the dielectric layer 102 can have about a 20 nm thickness at a pitch of 20 nm. In one or more embodiments, the thickness is greater than the pitch. As a function of the etching process used to pattern the dielectric material, depletion of elements at exposed surfaces can occur that increase hydrophilicity at the surface. For example, in the case of SiCOH based ultra-low k dielectrics, carbon can be depleted at the surface as a function of the etching process resulting in a thin silicon oxide ($SiO_2$) layer 106 of about 20 Angstroms formed on the exposed surfaces subsequent to patterning. The carbon depleted silicon dioxide layer 106 is hydrophilic, which results in a higher surface tension force relative to the underlying dielectric layer. A planarization process such as chemical mechanical planarization can be used to planarize the surface after patterning, which removes the element depleted dielectric material at the top surface thereof between the trench openings such that the element depleted dielectric material remains on the sidewalls and bottom surfaces of the patterned dielectric layer.

The patterned dielectric layer 102 is in accordance with one or more aspects of the present invention can be an ultra-low k dielectric having a dielectric constant (k-value) of less than 2.2 and can have a pitch of less than 40 nm. Suitable ultra-low k dielectric materials generally include, without limitation, incorporation of nanopores in structures containing silicon, carbon, oxygen and hydrogen (SiCOH), organic polymers, spin on organo-silicate glasses, or the like. The ultra-low K nanoporous dielectric films can be formed by chemical vapor deposition. The porous ultra-low k dielectric materials possess degraded mechanical strength relative to non-porous dielectrics and also have deteriorated thermal performance, which also impacts mechanical properties.

Figure 3:
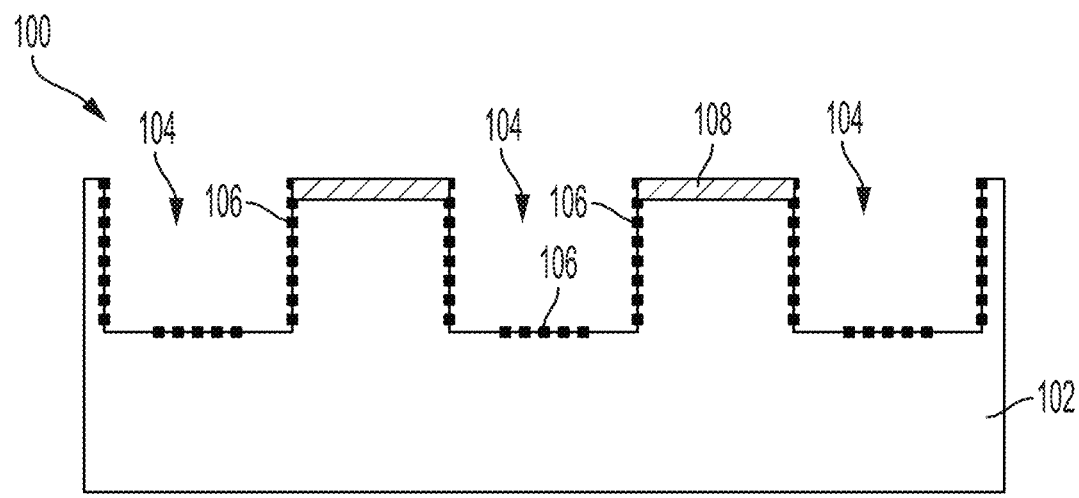
FIG. 3 depicts a cross section of the structure of FIG. 2 subsequent to a selective surface modification of a top surface of the patterned dielectric layer between open trenches in accordance with one or more embodiments of the present invention.

In FIG. 3, the patterned dielectric layer 102 is subjected to a selective surface modification process, wherein the exposed top surface of the dielectric layer (i.e., the uppermost dielectric surface between the trenches 104) is selectively modified with one or more elements such as nitrogen (N), carbon (C), silicon (Si), and mixtures thereof to increase hydrophobicity of the top dielectric surface 108 relative to the dielectric material itself. Surface modification of the top dielectric surface is not intended to be limited and can be by infusion, ion implantation, low power plasma, and/or chemical modification.

Ion implantation can be used to modify the surface properties of ULK dielectric materials without changing their bulk properties. Ions of N, C, Si, or mixtures thereof can be implanted into the dielectric surface.

Surface modification using low power plasma excitation can be made by plasma excitation of a nitrogen containing source, a carbon containing source, a silicon containing source, and/or mixtures thereof. By way of example, the nitrogen-containing source that can be used in providing a nitrogen-containing plasma includes, but is not limited to, $N_2$, NO, $N_2O$, $NH_3$, $N_2H_2$ and mixtures thereto.

Chemical surface modification can be made using a gas such as rapid thermal annealing in $N_2$, $NH_3$, $CO_2$ or like ambients. In other examples vapor phase silation, which is a well-known process, can be used to deposit silicon into the exposed dielectric surface and increase hydrophobicity.

In one or more embodiments, the depth of penetration of the element into the dielectric surface to increase hydrophobicity is less than 10 nm. In one or more other embodiments, the depth of penetration of the element to increase hydrophobicity is less than 5 nm, and in still one or more other embodiments, the depth of penetration of the element to increase hydrophobicity is less than 3 nm. In one or more embodiments, the depth of penetration of the element into the dielectric surface to increase hydrophobicity is at least than 0.5 nm. In one or more other embodiments, the depth of penetration of the element to increase hydrophobicity is at least than 1 nm, and in still one or more other embodiments, the depth of penetration of the element to increase hydrophobicity is less than 2 nm.

Figure 4:
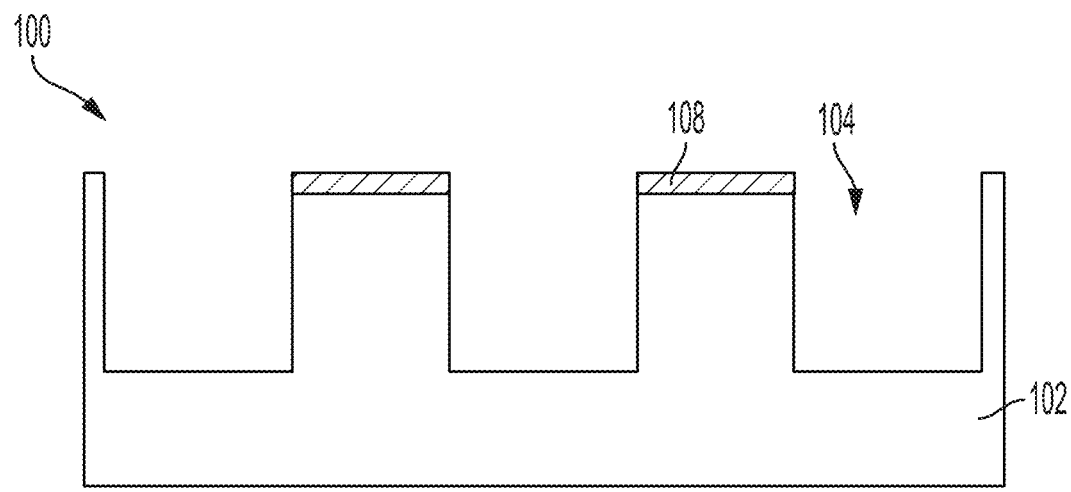
FIG. 4 depicts a cross section of the structure of FIG. 3 subsequent to removal of an element depleted layer in sidewalls and bottoms surfaces of the trench openings in accordance with one or more embodiments of the present invention.

In FIG. 4, a wet clean process is utilized to selectively remove the element depleted layer 106 from the sidewalls and the bottom of the trenches 104. The wet clean process is not intended to be limited and can include by way of example application of a dilute hydrofluoric acid (HF) solution. The particular wet etchant will generally depend on the composition of the element depleted layer, which is well within the routine skill of those in the art. Advantageously, the presence of the modified top surface 110 of the dielectric layer 102 between trench openings 104 prevents pattern collapse.

Figure 5:
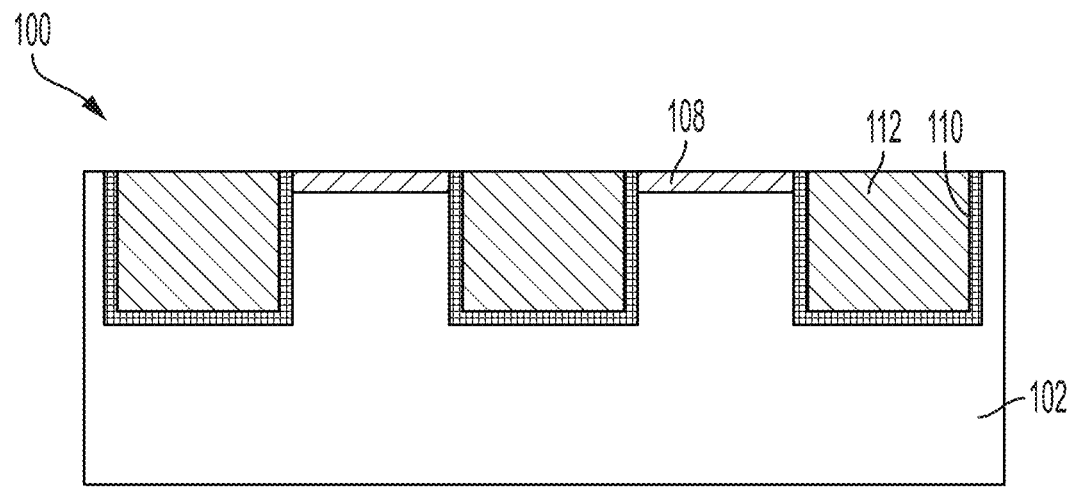
FIG. 5 depicts a cross section of the structure of FIG. 4 subsequent to metallization and planarization to the modified top surface of the patterned dielectric layer in accordance with one or more embodiments of the present invention.

In FIG. 5, a liner layer 110 (i.e., diffusion barrier layer) is then conformally deposited onto the patterned dielectric layer. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, to fabricate the integrated circuit 100 will not further diffuse into interlayer dielectric. The liner layer 110 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited, which will be used to define the metal conductor 112. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process stopping at the modified top surface 108 of the dielectric layer 102 to remove any metal overburden (includes seed layer and liner layer removal) such that a top surface of the metal conductor 112 is substantially coplanar to the modified top surface 108 of the dielectric layer 102 as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 6:
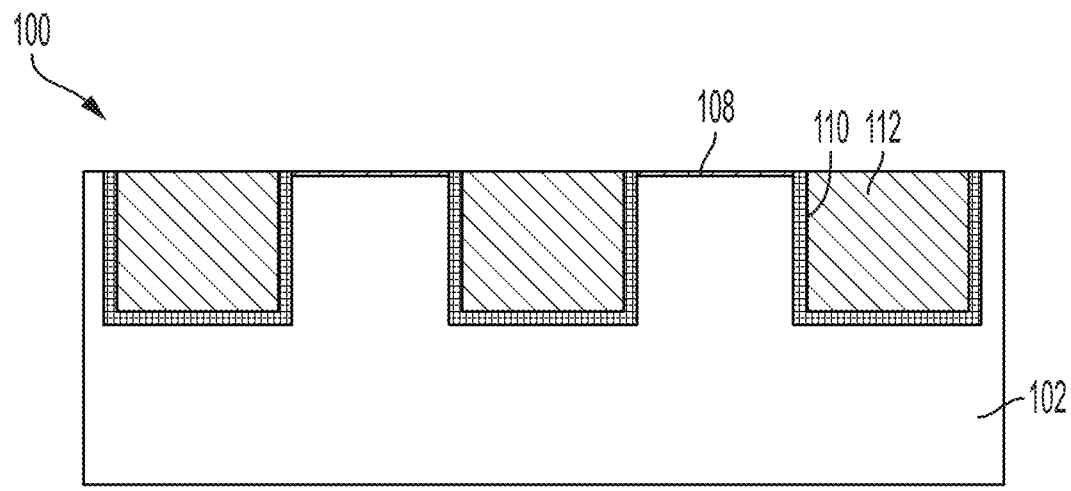
FIG. 6 depicts a cross section of the structure of FIG. 5 subsequent to metallization and planarization to remove at least a portion of the modified top surface of the patterned dielectric layer in accordance with one or more embodiments of the present invention.

In FIG. 6, the planarization process can be configured to remove a portion of the modified top surface 108 of the dielectric layer 102, which can be used to modulate the amount of reduced capacitance desired in some applications.

Parasitic capacitance between metal interconnects on the same or adjacent layers in the circuit can result in crosstalk between the metal lines or interconnects and/or resistance-capacitance (RC) delay, thereby reducing the response time of the device and degrading the overall performance of the device. The effects of parasitic capacitance between metal interconnects on the same or adjacent layers in the circuit is especially of concern as the current state of the art circuits can employ 4 to 5 levels of interconnection, while next generation devices can require 6, 7, or possibly 8 levels of interconnection.

Lowering the parasitic capacitance between metal interconnects separated by dielectric material can be accomplished by either increasing the thickness of the dielectric material or by lowering the dielectric constant of the dielectric material. Increasing the thickness of the dielectric materials, however, does not address parasitic capacitance within the same metallized layer or plane. As a result, to reduce the parasitic capacitance between metal interconnects on the same or adjacent layers, one must change the material used between the metal lines or interconnects to a material having a lower dielectric constant. The integration of ULK dielectric materials in the BEOL metallization structure provides a desired reduction in capacitance. As for surface modification of the ULK dielectric material, the impact on capacitance is relatively small. For example, capacitance reduction of a ULK dielectric material having a k value of 2.2 relative to a dielectric material having a k value of 2.7 at a 30 nm pitch results in a capacitance reduction of about 10%. Surface medication of the same ULK dielectric and at the same pitch results in a capacitance reduction of about 5% relative to the dielectric material having a k value of 2.7, while providing sufficient hydrophobicity to prevent pattern collapse during wet processing.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of the line process for forming a metallization structure layer, the process comprising:
    depositing a dielectric layer onto a surface, wherein the dielectric layer comprises an ultra-low k dielectric having a k value of less than 2.2;
    lithographically patterning and etching the dielectric layer to form trench openings;
    selectively modifying a top surface of the dielectric between the trench openings to form a modified top surface having greater hydrophobicity than the ultra-low k dielectric underlying the modified top surface;
    wet processing to clean and/or remove residues from prior fabrication steps;
    depositing a liner layer onto sidewalls and a bottom surface defined by trench openings;
    depositing a metal onto the liner layer and into the one or more openings; and
    planarizing a surface of the metal to remove an excess of the metal such that the uppermost surfaces of the metal and the dielectric layer are coplanar to each other.

2. The process of claim 1, wherein selectively modifying the top surface of the dielectric comprises depositing elements comprising nitrogen, carbon, silicon and mixtures thereof.

3. The process of claim 2, wherein selectively depositing the elements is at a depth of less than 10 nanometers.

4. The process of claim 1, wherein lithographically patterning and etching the dielectric layer to form trench openings is at a 1:1 pitch of less than 40 nanometers.

5. The process of claim 1 further comprising forming an oxide layer on sidewalls and bottom surfaces of the trench openings subsequent to forming the trench openings and prior to selectively depositing the elements.

6. The process of claim 1, wherein selectively depositing the elements comprises an infusion process, an ion implantation process, a plasma process or a chemical process.

7. The process of claim 1, wherein the dielectric layer comprises a thickness within a range from 50 nm to 500 nm.

8. The process of claim 1, wet processing to clean and/or remove residues from prior fabrication steps removes an oxide layer formed on the sidewalls and bottom surfaces of the trench openings.

9. The process of claim 1, wherein the ultra-low k dielectric comprises nanopores.

10. The process of claim 1, wherein the modified top surface has increased mechanical strength relative to the ultra-low k dielectric underlying the modified top surface.

11. A back end of the line process for modulating hydrophobicity at a top surface of an ultra-low k dielectric material located between trench openings in the ultra-low k dielectric material, the process comprising:

selectively depositing an element comprising nitrogen, carbon, silicon, or mixtures thereof into the top surface of the ultra-low k dielectric material, wherein depositing the elements increases hydrophobicity at the top surface relative to the ultra-low k dielectric material underlying the top surface;

depositing a conductive material into the trench openings; and planarizing to recess the top surface of the ultra-low k dielectric material such that uppermost surfaces of the conductive material and the ultra-low k dielectric material are coplanar.

12. The process of claim 11, wherein selectively depositing the elements comprises an infusion process, an ion implantation process, a plasma process or a chemical process.

13. The process of claim 11, wherein selectively depositing the elements is at a depth of less than 10 nanometers.

* * * * *